United States Patent
Han

(10) Patent No.: US 10,675,711 B2
(45) Date of Patent: Jun. 9, 2020

(54) MASK EXTENSION WELDING DEVICE FOR THIN FILM DEPOSITION

(71) Applicant: Samsung Display Co., Ltd., Yongin-si (KR)

(72) Inventor: Jeongwon Han, Yongin-si (KR)

(73) Assignee: Samsung Electronics Co., Ltd., Yongin-si (KR)

(*) Notice: Subject to any disclaimer, the term of this patent is extended or adjusted under 35 U.S.C. 154(b) by 994 days.

(21) Appl. No.: 15/098,842

(22) Filed: Apr. 14, 2016

(65) Prior Publication Data
US 2017/0106472 A1    Apr. 20, 2017

(30) Foreign Application Priority Data
Oct. 16, 2015    (KR) .................. 10-2015-0144739

(51) Int. Cl.
*B23K 26/21*    (2014.01)
*C23C 14/04*    (2006.01)
*B23K 26/035*    (2014.01)
*B23K 26/244*    (2014.01)
(Continued)

(52) U.S. Cl.
CPC ............ *B23K 26/21* (2015.10); *B23K 26/037* (2015.10); *B23K 26/244* (2015.10); *B23K 37/0443* (2013.01); *C23C 14/042* (2013.01); *C23C 14/24* (2013.01)

(58) Field of Classification Search
CPC ............... B23K 26/037; B23K 26/244; B23K 26/0443; B23K 26/10; B23K 26/12; B23K 26/127; B23K 26/21–24; B23K 26/14; B23K 37/0435; B23K 37/0408;
(Continued)

(56) References Cited

U.S. PATENT DOCUMENTS

| 7,172,674 B2* | 2/2007 | Engesser | H01L 21/6704 118/300 |
| 2006/0237129 A1* | 10/2006 | Chen | B23K 26/0604 156/272.8 |

(Continued)

FOREIGN PATENT DOCUMENTS

| JP | 2003-178673 | 6/2003 |
| JP | 2006-110607 | 4/2006 |
| KR | 10-1991-0019101 | 11/1991 |

(Continued)

OTHER PUBLICATIONS

Nano-TEM Co., Ltd., Porous Ceramic Vacuum Chuck Table (PC-VCT), 2008.

*Primary Examiner* — Michael G Hoang
(74) *Attorney, Agent, or Firm* — H.C. Park & Associates, PLC

(57) ABSTRACT

A mask extension welding apparatus for thin film deposition to extend and weld a mask on a frame includes an extension unit configured to extend the mask in a first direction, a pressure unit configured to press the mask towards the frame, and a laser welding unit configured to weld the mask and the frame. The pressure unit includes an upper housing, a lower housing spaced apart from the upper housing with respect to a fluid inlet, and a porous plate disposed at a downstream of the fluid inlet, the porous plate connecting the upper housing and the lower housing, and configured to eject a fluid supplied through the fluid inlet towards the mask.

20 Claims, 9 Drawing Sheets

(51) Int. Cl.
*B23K 37/04* (2006.01)
*C23C 14/24* (2006.01)

(58) Field of Classification Search
CPC ..... C23C 14/042; C23C 14/24; C23C 16/042; B05C 21/005; B05B 15/00
USPC .......... 219/121.63, 121.82, 121.83; 118/504, 118/720, 721, 503, 505
See application file for complete search history.

(56) References Cited

U.S. PATENT DOCUMENTS

2013/0318774 A1   12/2013  Kang
2015/0114293 A1*  4/2015  Chung .................. C23C 14/042
                                                      118/721

FOREIGN PATENT DOCUMENTS

| KR | 1994-0001221 | 1/1994 |
|---|---|---|
| KR | 10-2011-0046780 | 5/2011 |
| KR | 10-2013-0134707 | 12/2013 |

* cited by examiner

MASK EXTENSION WELDING DEVICE FOR THIN FILM DEPOSITION

CROSS-REFERENCE TO RELATED APPLICATION

This application claims priority from and the benefit of Korean Patent Application No. 10-2015-0144739, filed on Oct. 16, 2015, which is hereby incorporated by reference for all purposes as if fully set forth herein.

BACKGROUND

Field

One or more exemplary embodiments relate to a mask extension welding device for thin film deposition.

Discussion of the Background

An organic light-emitting display apparatus including a thin-film transistor (TFT) may be used in a mobile device, for example, a smart phone, a tablet personal computer, a laptop computer, a digital camera, a camcorder, and a portable information terminal, and also in an electronic apparatus, for example, a desktop computer, a television, and a billboard.

A thin film of the organic light-emitting display apparatus may be formed by using a vacuum deposition method. A patterned thin film may be formed by depositing a raw material of the thin film on a substrate, when a deposition mask having the same pattern as the thin film which is to be formed on the substrate is placed on the substrate. Generally, a deposition mask is extended by a frame, and then both ends of the deposition mask are coupled to the frame by a laser welding method. In the laser welding method, a pressure member may be provided to press both ends of the deposition mask, such that the deposition mask is in close-contact with the frame.

However, when the pressure member presses both ends of the deposition mask, a gap between the deposition mask and the frame may be partially widened, which may cause welding defects during welding the deposition mask and the frame.

The above information disclosed in this Background section is only for enhancement of understanding of the background of the inventive concept, and, therefore, it may contain information that does not form the prior art that is already known in this country to a person of ordinary skill in the art.

SUMMARY

One or more exemplary embodiments include a mask extension welding device for thin film deposition.

Additional aspects will be set forth in the detailed description which follows, and, in part, will be apparent from the disclosure, or may be learned by practice of the inventive concept.

According to an exemplary embodiment of the present invention, a mask extension welding apparatus for thin film deposition to extend and weld a mask on a frame includes an extension unit configured to extend the mask in a first direction, a pressure unit configured to press the mask towards the frame, and a laser welding unit configured to weld the mask and the frame. The pressure unit includes an upper housing, a lower housing spaced apart from the upper housing with respect to a fluid inlet, and a porous plate disposed at a downstream of the fluid inlet, the porous plate connecting the upper housing and the lower housing, and configured to eject a fluid supplied through the fluid inlet towards the mask.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

Figure 1:
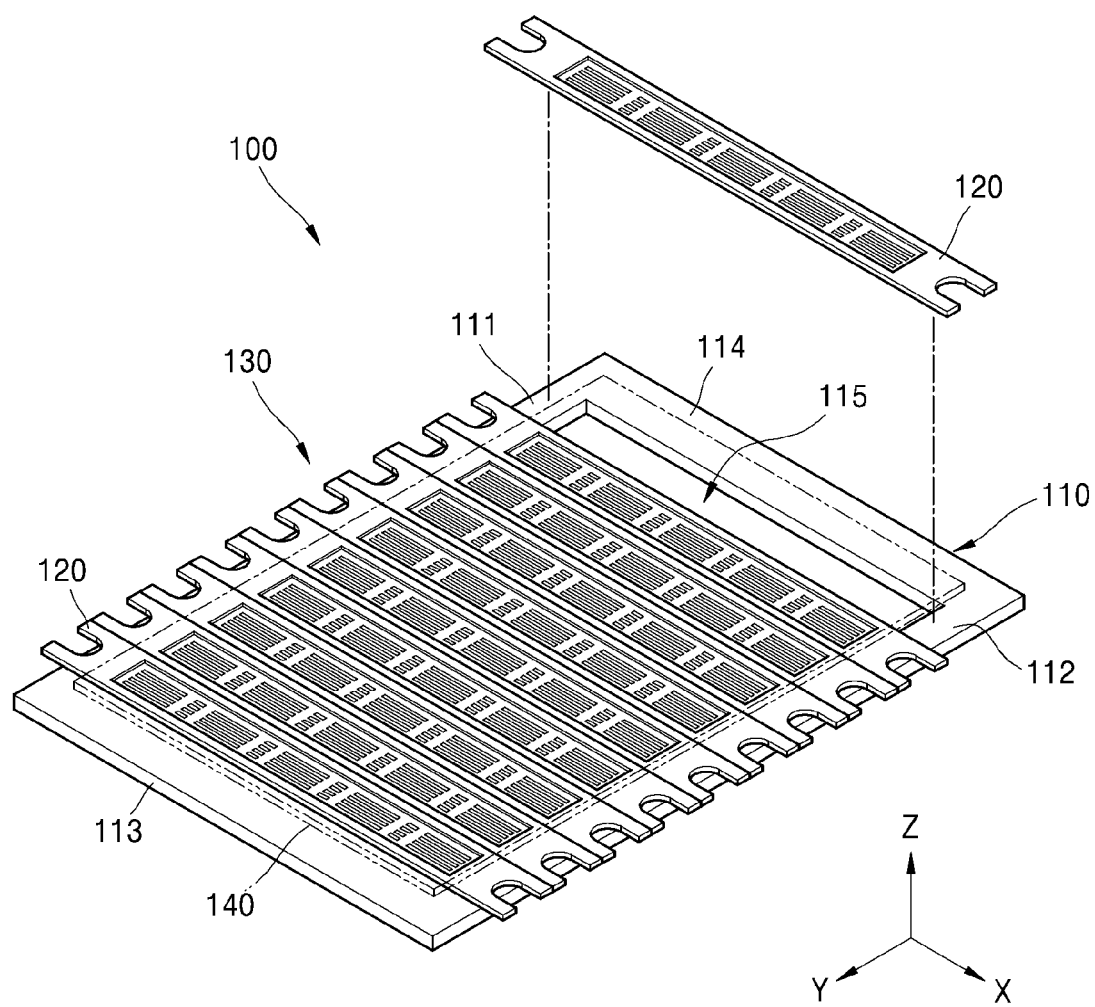
FIG. 1 is a perspective view illustrating a mask frame assembly according to an exemplary embodiment of the present invention.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

FIG. 1 is a perspective view illustrating a mask frame assembly 100.

Referring to FIG. 1, the mask frame assembly 100 includes a frame 110 and a mask 130 including divisional masks 120.

The frame 110 may include an opening 115, a first frame 111, a second frame 112, a third frame 113, and a fourth frame 114 surrounding the opening 115. The first, second, third, and fourth frames 111, 112, 113, and 114 may be connected to each other.

The first frame 111 and the second frame 112 face each other in an X axis direction and are disposed in a Y axis direction. The third frame 113 and the fourth frame 114 face each other in the Y axis direction and are disposed in the X axis direction. The first frame 111, the second frame 112, the third frame 113, and the fourth frame 114 are connected to each other and form a rectangular frame. The frame 110 may include a material having a low deformability during welding the mask 130 to the frame 110, for example, a metal having a high rigidity.

The mask 130 may be disposed on the frame 110. A precise deposition pattern may be obtained by improving adhesiveness between the mask 130 and a substrate 140, which is disposed on the mask 130, and by decreasing a shadow. The mask 130 may be manufactured by using a thin plate. The mask 130 may include a material, for example, stainless steel, Invar, nickel (Ni), cobalt (Co), a nickel alloy, and a nickel-cobalt alloy.

The mask 130 may include divisional masks 120, which are separated from each other in the Y axis direction, in order to prevent deflection of the mask 130 by self-gravity. The divisional masks 120 may be a stick. According to the present exemplary embodiment, a width of the mask 130 is less than a length of the mask 130. It is noted that the present inventive concept is not limited to a particular structures of the mask 130, as such, the width and the length of the mask 130 may be varied.

The divisional masks 120 may be separated from each other in a direction corresponding to the Y axis direction, which intersects an extension direction, corresponding to the X axis direction. In detail, the divisional masks 120 may be continuously arranged between the third frame 113 and the fourth frame 114, and both ends of the respective divisional masks 120 may be fixed to corresponding ones of the first frame 111 and the second frame 112 by welding. The divisional masks 120 may cover the opening 115.

Figure 2:
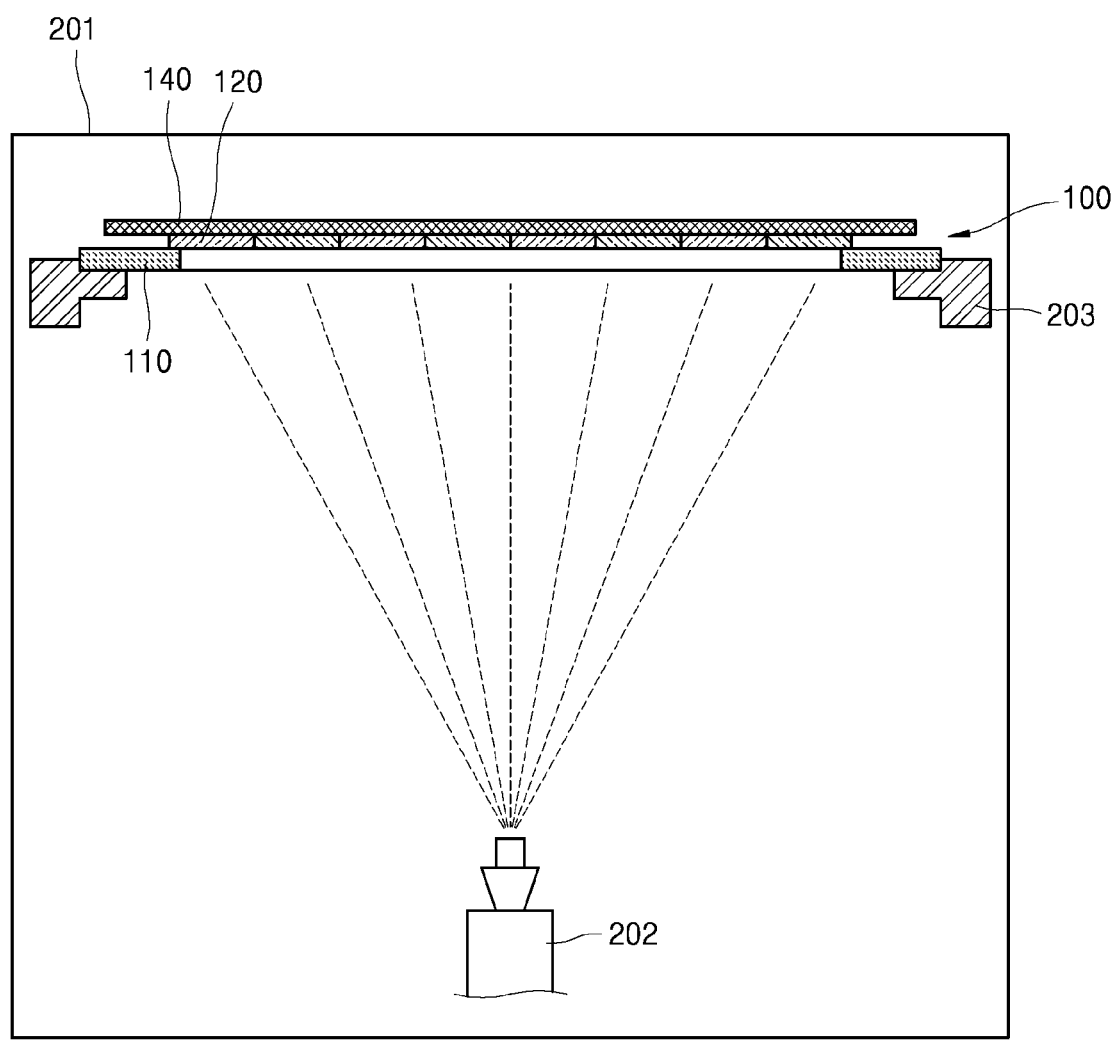
FIG. 2 is a view schematically illustrating a process of forming a deposition layer on a substrate using the mask frame assembly of FIG. 1.

FIG. 2 is a view schematically illustrating a process of forming a deposition layer on the substrate 140 using the mask frame assembly 100 of FIG. 1.

Referring to FIG. 2, a vacuum chamber 201 is provided to deposit an organic emissive layer or an electrode of an organic light-emitting display apparatus by using the mask frame assembly 100.

A deposition source 202 may be disposed at a bottom portion of the vacuum chamber 201, and the mask frame assembly 100 may be disposed at a top portion of the vacuum chamber 201. The mask frame assembly 100 may include the divisional masks 120 as illustrated in FIG. 1. The divisional masks 120 may be disposed on the frame 110. The substrate 140 may be disposed on the divisional masks 120. The vacuum chamber 201 may further include a support unit 203 to which an edge of the mask frame assembly 100 is fixed. A process of depositing the deposition layer on the substrate 140 will be described below.

The mask frame assembly 100 is fixed to the support unit 203, and the substrate 140 for deposition is disposed on the divisional masks 120. When a deposition material is dispersed from the deposition source 202, which is disposed at the bottom portion of the vacuum chamber 201, toward the mask frame assembly 100, the deposition material passing through the divisional masks 120 may be deposited on a side of the substrate 140.

According to an exemplary embodiment of the present invention, a precise welding of the divisional masks 120 with respect to the frame 110 is performed, so that a deposition pattern is formed on a desired portion of the substrate 140. That is, in an area in which the frame 110 and the divisional masks 120 are welded, an empty space between the frame 110 and the divisional masks 120 is substantially reduced so as to improve the adhesiveness between the frame 110 and the divisional masks 120.

Figure 3:
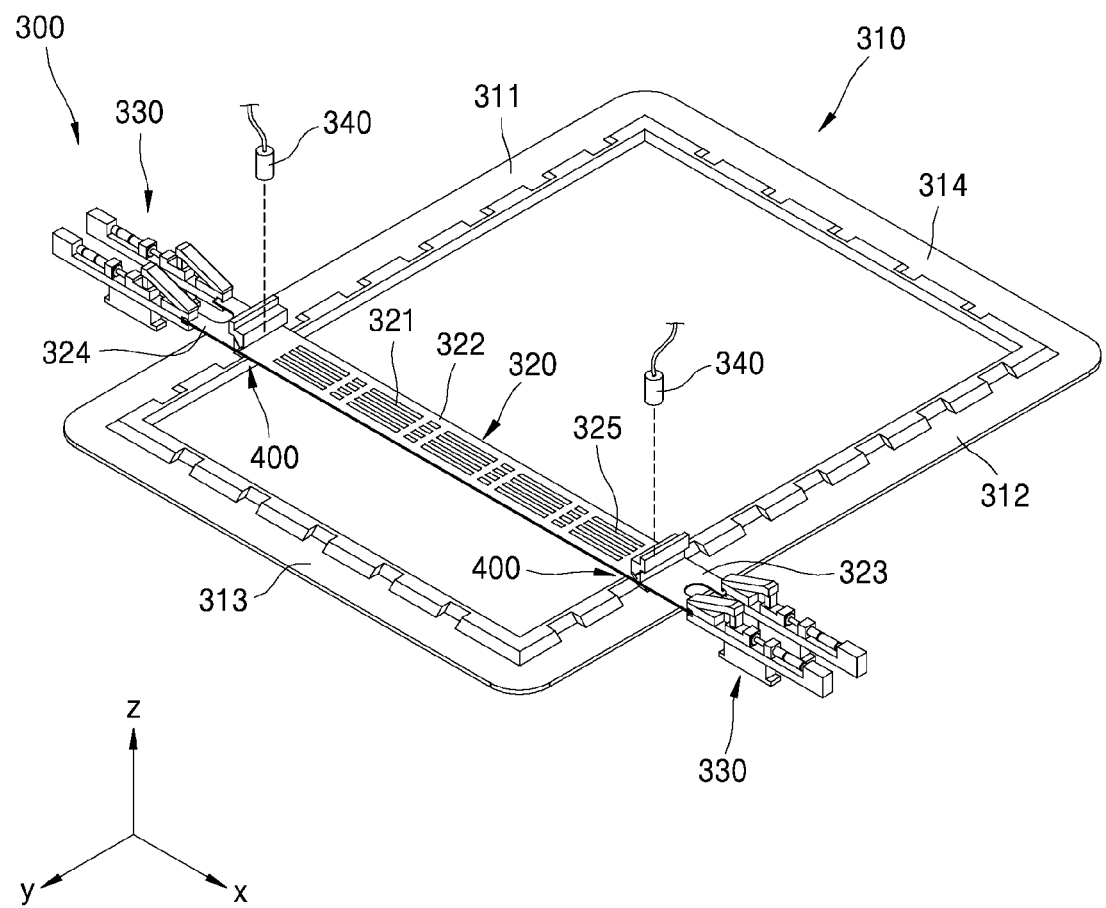
FIG. 3 is a perspective view illustrating a mask extension welding device for thin film deposition according to an exemplary embodiment of the present invention.
Figure 4:
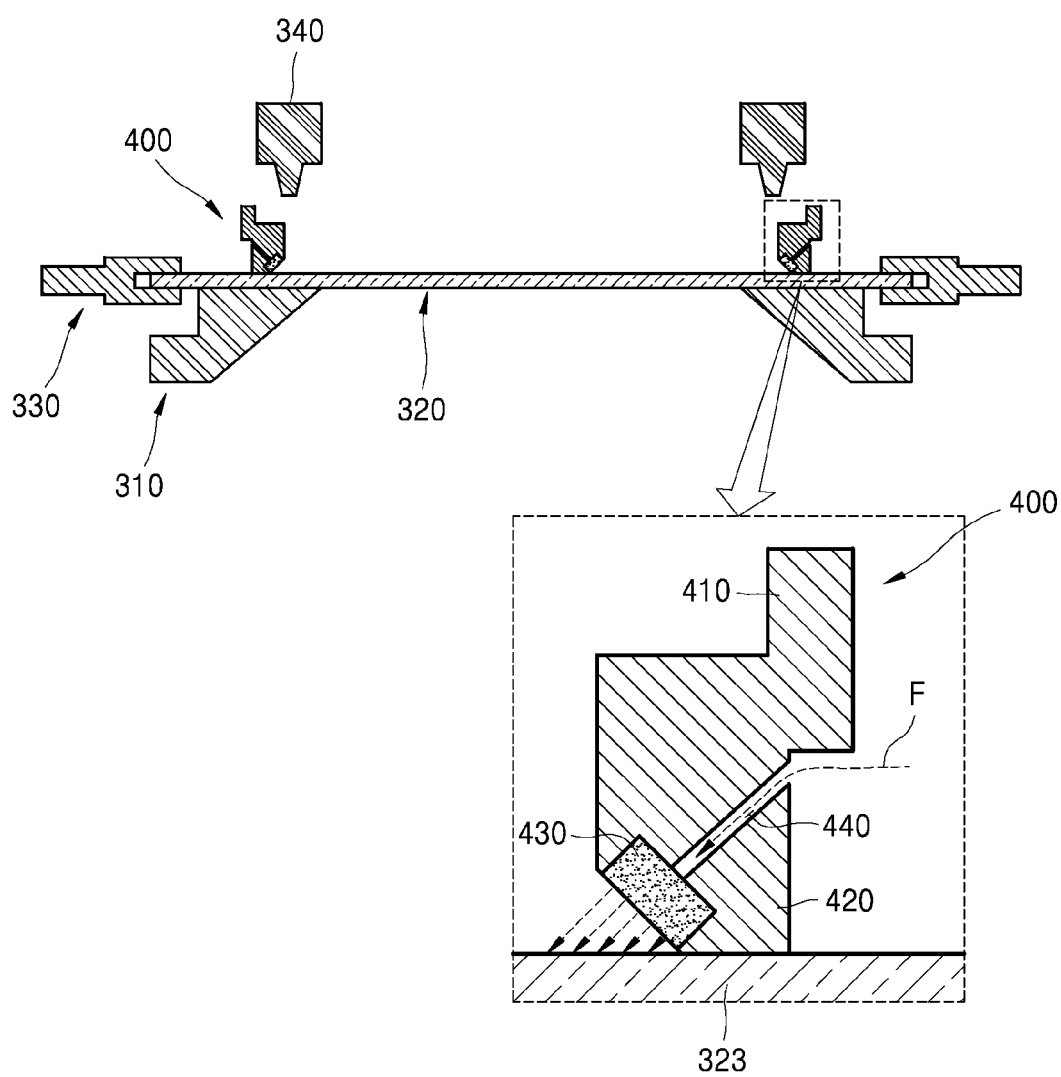
FIG. 4 is a cross-sectional view illustrating a pressure unit of FIG. 3.
Figure 5:
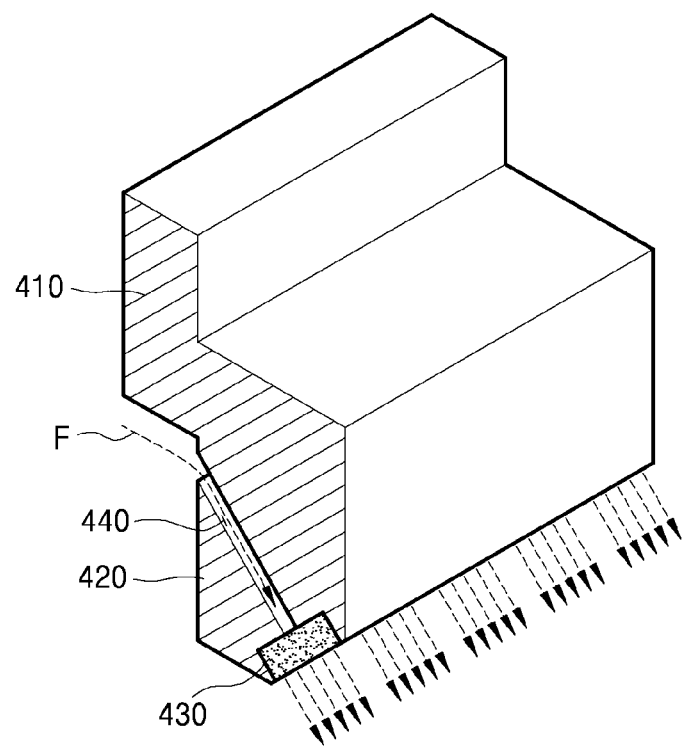
FIG. 5 is a perspective view illustrating the pressure unit of FIG. 4.
Figure 6:
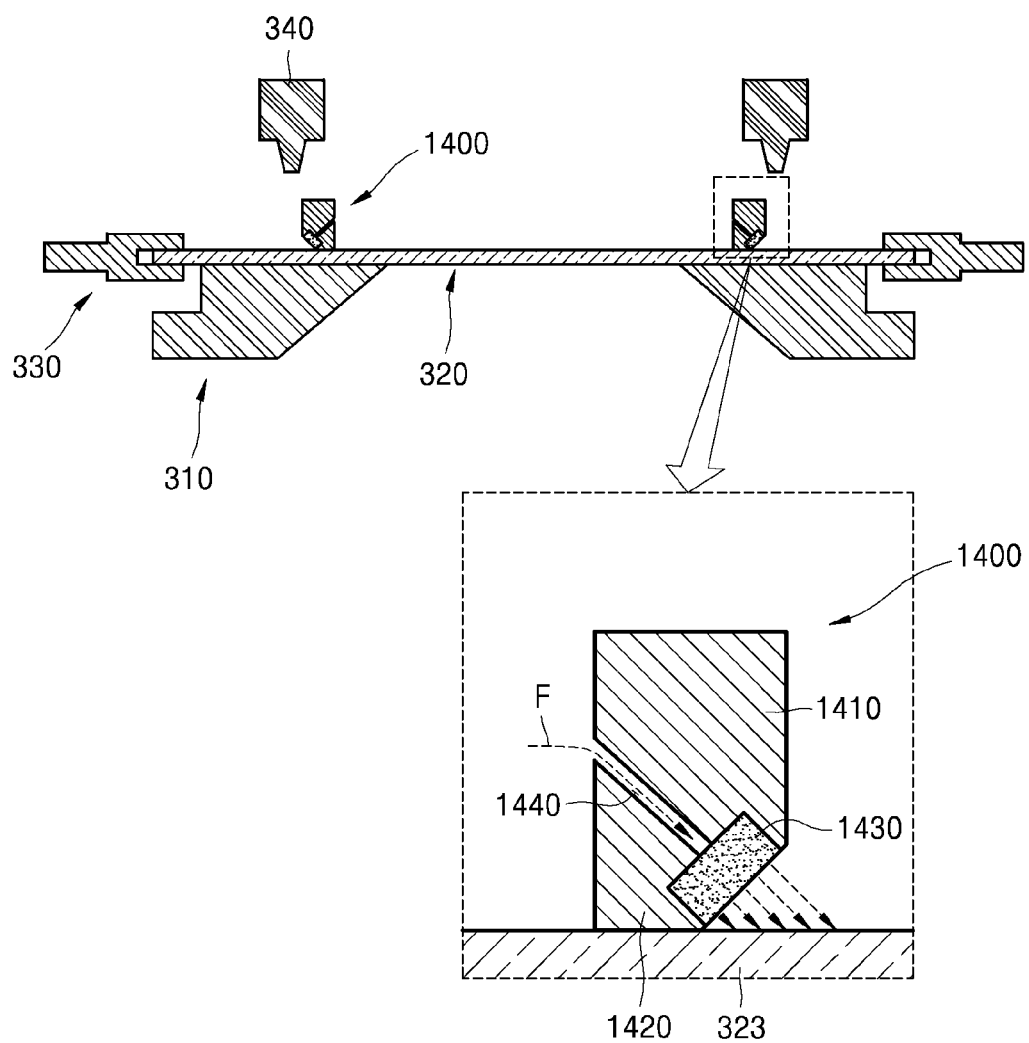
FIG. 6 is a cross-sectional view illustrating a pressure unit according to an exemplary embodiment of the present invention.
Figure 7:
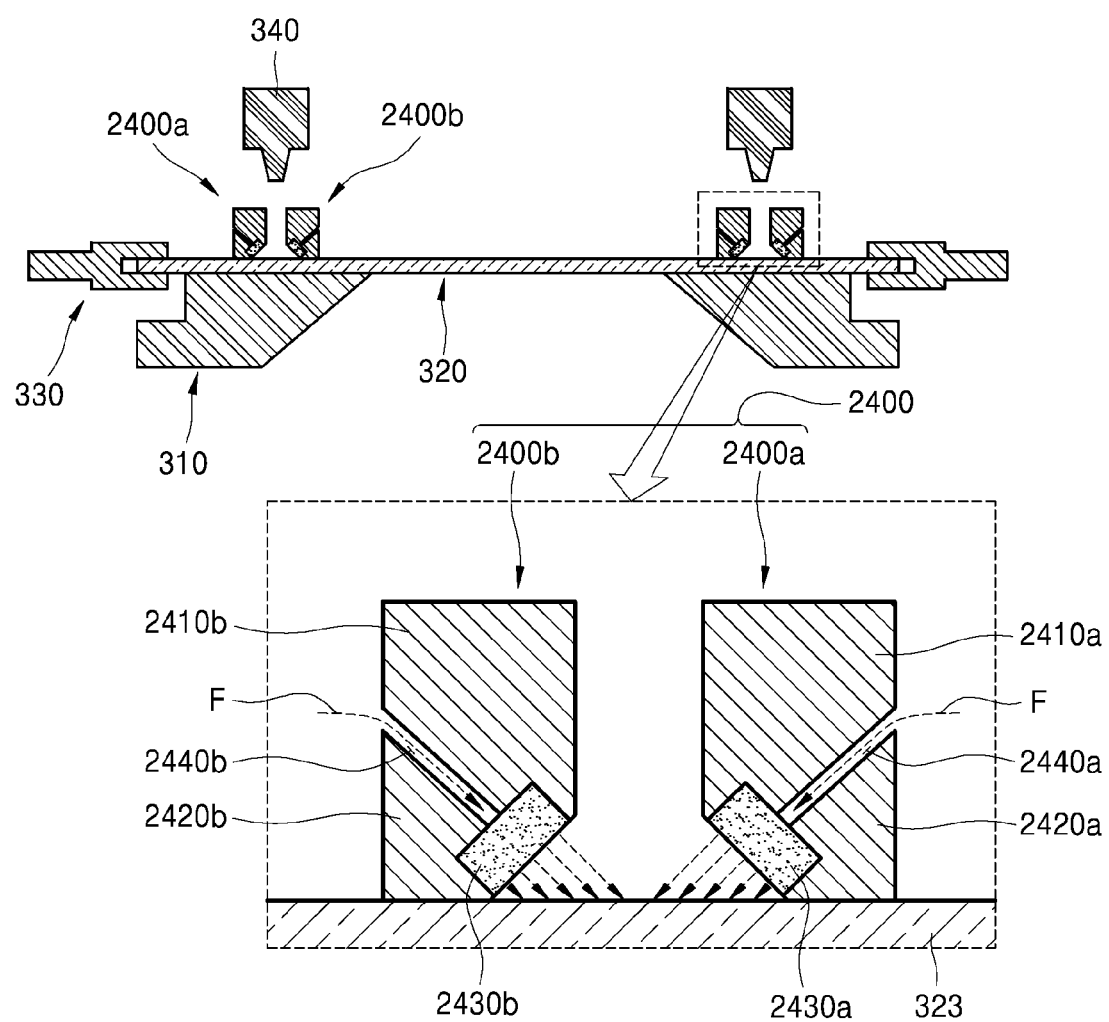
FIG. 7 is a cross-sectional view illustrating a pressure unit according to an exemplary embodiment of the present invention.

FIG. 3 is a perspective view illustrating a mask extension welding apparatus 300 for thin film deposition according to an exemplary embodiment of the present invention. FIG. 4 is a cross-sectional view illustrating a pressure unit 400 of FIG. 3. FIG. 5 is a perspective view illustrating the pressure unit 400 of FIG. 4. FIG. 6 is a cross-sectional view illustrating a pressure unit 1400 according to an exemplary embodiment of the present invention. FIG. 7 is a cross-sectional view illustrating a pressure unit 2400 according to an exemplary embodiment of the present invention.

Referring to FIGS. 3 through 5, a frame 310 may have a rectangular frame structure. The frame 310 may include a first frame 311 and a second frame 312, which face each other in an X axis direction and are disposed in an Y axis direction, and a third frame 313 and a fourth frame 314, which face each other in the Y-axis direction and are disposed in the X axis direction.

Divisional masks 320 are disposed on the frame 310 in the Y axis direction. A width of the divisional mask 320 may be less than a length of the divisional mask 320 in an extension direction of the divisional mask 320.

Deposition pattern units 321 are disposed on the divisional mask 320 and are spaced apart from each other by predetermined intervals. The deposition pattern units 321 may include the same pattern as the deposition layer to be deposited on a substrate. A rib 322 may be formed between the adjacent deposition pattern units 321. The rib 322 may connect the deposition pattern units 321, which are disposed in a lengthwise direction of the divisional mask 320.

According to the present exemplary embodiment, a welding area where the frame 310 and the divisional mask 320 are welded may be disposed between outermost deposition pattern units 325 and corresponding first and second ends 323 and 324 of the divisional mask 320. Both of the first and second ends 323 and 324 of the divisional masks 320 may be disposed on the frame 310 along the extension direction, that is, the X axis direction, and then welded to the frame 310. In detail, the first end 323 and the second end 324 facing each other with respect to a lengthwise direction of the divisional mask 320 are disposed on (or supported by) the frame 310, and the first end 323 and the second end 324 of the divisional mask 320 may be welded to the second frame 312 and the first frame 311, respectively.

According to the present exemplary embodiment, the mask extension welding apparatus 300 for thin film deposition may be used to easily process the welding of the divisional mask 320 to the frame 310. The mask extension welding apparatus 300 for deposition will be explained below in detail.

The mask extension welding apparatus 300 includes an extension unit 330, a pressure unit 400, and a laser welding unit 340. The divisional mask 320 may be disposed along the lengthwise direction, that is, the X axis direction. The divisional mask 320 may be extended by the extension unit 330. In detail, the first end 323 and the second end 324 of the divisional mask 320 are disposed on the second frame 312 and the first frame 311, respectively, such that the divisional mask 320 is disposed on the first frame 311 and the second frame 312. The extension unit 330 may extend the divisional mask 320 in the lengthwise direction and then fix the divisional mask 320 to the frame 310.

According to the present exemplary embodiment, the extension unit 330 may be a mask extension clamp. That is, the extension unit 330 may clamp the first end 323 and the second end 324 and extend the divisional mask 320.

The pressure unit 400 may render the divisional mask 320 to close-contact the frame 310. The pressure unit 400 may be installed at positions adjacent to the corresponding first and second ends 323 and 324. In detail, the pressure unit 400 may be disposed between the outmost deposition pattern unit 325 and the corresponding first and second ends 323 and 324. In detail, the pressure unit 400 may press an upper side of the divisional mask 320, which is disposed on the frame 310. Accordingly, surfaces of the frame 310 and the divisional mask 320, which face each other, may be in close-contact with each other.

Referring to FIG. 4, the pressure unit 400 may include an upper housing 410, a lower housing 420, a porous plate 430, and a fluid inlet 440.

The upper housing 410 and the lower housing 420 may be spaced apart from each other and may be connected to each other through the porous plate 430. The fluid inlet 440 may be formed in a space between the upper housing 410 and the lower housing 420. Although not illustrated in drawings, a fluid supply unit (not illustrated) may be connected to the fluid inlet 440 and supply a fluid F to the fluid inlet 440 from outside. The fluid F supplied from the fluid supply unit may move along the fluid inlet 440 and then be delivered to the porous plate 430.

According to the present exemplary embodiment, the fluid F may be gas. In detail, the fluid F may be air or inert gas, such as nitrogen (N), helium (He) or argon (Ar). Alternatively, the fluid F may be another gas, which does not respond to laser. In detail, one side of the lower housing 420 may press a portion of the first and second ends 323 and 324 of the divisional mask 320. The porous plate 430 may eject the fluid F, which is supplied to the fluid inlet 440 and passes through the fluid inlet 440, toward the divisional mask 320. The fluid F ejected from the porous plate 430 may press the first and second ends 323 and 324 of the divisional mask 320.

In this manner, the adhesiveness between the frame 310 and the divisional mask 320 may be improved by using the lower housing 420, which presses the first and second ends 323 and 324 of the divisional mask 320 to the frame 310 according to a direct contact, and by using the porous plate 430, which uniformly presses the first and second ends 323 and 324 of the divisional mask 320 to the frame 310 according to the ejection of the fluid F.

A pressure of the fluid F, which is ejected from the porous plate 430 toward the divisional mask 320, may be uniformly applied to an entire area of the divisional mask 320, in which the frame 310 and the divisional mask 320 are welded. In addition, the pressure of the fluid F may be controlled by controlling an amount of the fluid F. Accordingly, a gap may not occur in the area in which the frame 310 and the divisional mask 320 are welded, and the frame 310 and the divisional mask 320 are combined in close-contact with each other. When the gap is removed by improving the adhesiveness of the frame 310 and the divisional mask 320, a defect rate during a process of welding the frame 310 and the divisional mask 320 may be reduced.

The laser welding unit 340 may irradiate laser on a side of the divisional mask 320. More particularly, laser may be irradiated on an internal direction or an external direction of the divisional mask 320 with respect to an area in which the lower housing 420 contacts the corresponding first and second ends 323 and 324 of the divisional mask 320. As used herein, the internal direction (or side) of the divisional mask 320 may be a direction (or side) towards the center of the divisional mask 320 with respect to an area in which the lower housing 420 contacts the corresponding first and second ends 323 and 324 of the divisional mask 320.

The laser welding unit 340, as illustrated in FIG. 4, irradiates laser onto an internal side of the divisional mask 320. The fluid inlet 440, as illustrated in FIG. 4, may be inclined with respect to the divisional mask 320, to direct the fluid F toward the internal direction of the divisional mask 320. In order to form the inclined fluid inlet 440, surfaces of the upper housing 410 and the lower housing 420, which face each other, may be inclined with respect to the divisional mask 320. The porous plate 430, which is disposed at a downstream of the fluid inlet 440 and connects the upper housing 410 and the lower housing 420, may be inclined between the upper housing 410 and the lower housing 420, so that the fluid F of the fluid inlet 440 is ejected toward the divisional mask 320.

Referring to FIG. 6, in the pressure unit 1400 according to an exemplary embodiment of the present invention, a fluid inlet 1440 is inclined to direct the fluid F in the external direction of the divisional mask 320. As used herein, an external direction (or side) of the divisional mask 320 may be a direction (or side) facing away from the center of the divisional mask 320 with respect to an area in which a lower housing 1420 contacts the corresponding first and second ends 323 and 324 of the divisional mask 320 contact each other.

In this manner, a porous plate 1430, which is disposed at a downstream of the fluid inlet 1440 and connects an upper housing 1410 and the lower housing 1420, may be installed between the upper housing 1410 and the lower housing 1420 in an inclined state corresponding to a direction in which the fluid inlet 1440 directs the fluid F toward the divisional mask 320.

Referring to FIG. 7, a pressure unit 2400 according to an exemplary embodiment of the present invention may include a first pressure unit 2400a and a second pressure unit 2400b.

The first pressure unit 2400a may include a first upper housing 2410a, a first lower housing 2420a, which is spaced apart from the first upper housing 2410a with respect to a first fluid inlet 2440a, and a first porous plate 2430a, which is disposed at a downstream of the first fluid inlet 2440a, connects the first upper housing 2410a and the first lower housing 2420a, and ejects the fluid F supplied through the first fluid inlet 2440a toward the divisional mask 320.

The second pressure unit 2400b may include a second upper housing 2410b, a second lower housing 2420b, which is spaced apart from the second upper housing 2410b with respect to a second fluid inlet 2440b, and a second porous plate 2430b, which is disposed at a downstream of the second fluid inlet 2440b, connects the second upper housing 2410b and the second lower housing 2420b, and ejects the fluid F supplied through the second fluid inlet 2440b toward the divisional mask 320. The first fluid inlet 2440a and the second fluid inlet 2440b may be disposed symmetrically with each other. In detail, the first fluid inlet 2440a of the first pressure unit 2400a is inclined to direct the fluid F toward the internal direction of the divisional mask. That is, surfaces of the first upper housing 2410a and the first lower housing 2420a, which face each other, are inclined, so that the first fluid inlet 2440a is formed to be inclined.

The second fluid inlet 2440b of the second pressure unit 2400b is inclined to direct the fluid F toward the external direction of the divisional mask 320. That is, surfaces of the first upper housing 2410a and the first lower housing 2420a, which face each other, are inclined so that the first fluid inlet 2440a is formed to be inclined.

The first porous plate 2430a, which is disposed at a downstream of the first fluid inlet 2440a and connects the first upper housing 2410a and the first lower housing 2420a, may be installed between the first upper housing 2410a and the first lower housing 2420a in an inclined state, so as to correspond to a direction in which the fluid F directed through the first fluid inlet 1440a is ejected toward the divisional mask 320.

The second porous plate 2430b, which is disposed at a downstream of the second fluid inlet 2440b and connects the second upper housing 2410b and the second lower housing 2420b, may be installed between the second upper housing 2410b and the second lower housing 2420b in an inclined state, so as to correspond to a direction in which the fluid F directed through the second fluid inlet 1440b is ejected toward the divisional mask 320.

Figure 8:
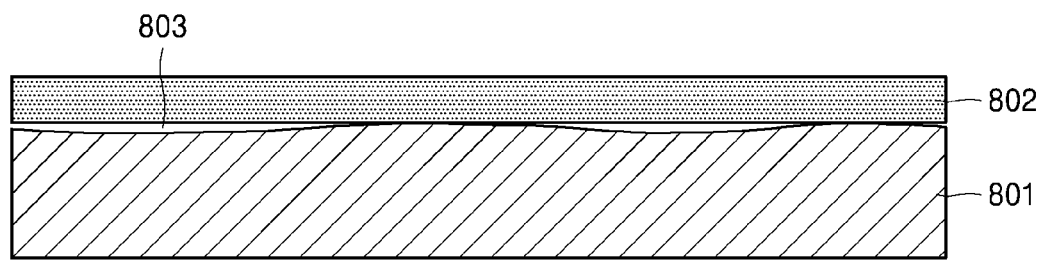
FIG. 8 is an enlarged view illustrating a close-contact state between a mask and a frame according to a comparative embodiment.
Figure 9:
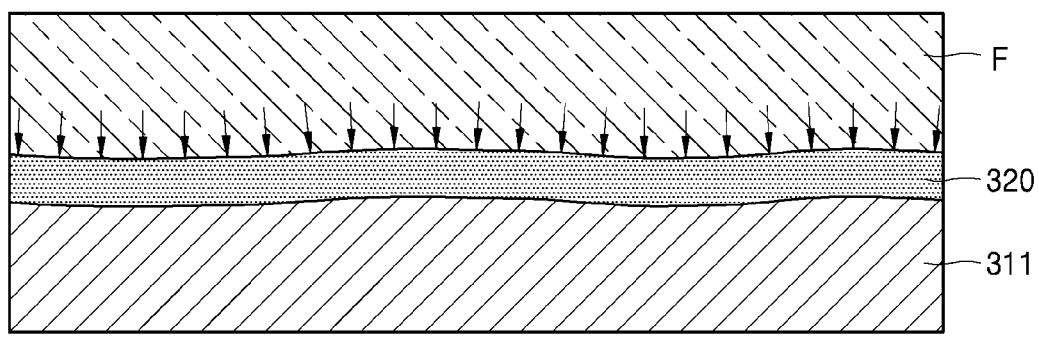
FIG. 9 is an enlarged view illustrating a close-contact state between a mask and a frame according to an exemplary embodiment of the present invention.

FIG. 8 is an enlarged view illustrating a contact state between a mask 802 and a frame 801 according to a comparative embodiment. FIG. 9 is an enlarged view illustrating a close-contact state between the mask 320 and the first frame 311 according to an exemplary embodiment of the present invention.

Referring to FIG. 8, according to the comparative embodiment, since the frame 801 and the mask 802 are not properly pressed at an area to be in close-contact with each other, a gap 803 is generated at the area of the frame 801 and the mask 802. Accordingly, a welding defect is generated.

Referring to FIG. 9, in the mask 320 and the first frame 311 according to an exemplary embodiment of the present invention, the fluid F presses through the divisional mask 320 toward the first frame 311. The fluid F presses the divisional mask 320 until the divisional mask 320 is in close-contact with the first frame 311.

After the divisional mask 320 is in close-contact with the first frame 311, a uniform pressure is applied to an entire area that is to be welded in a vertical direction of the first frame 311, as illustrated by arrows in FIG. 9. Accordingly, a gap is not generated at the area in which the mask 320 and the first frame are in close-contact with each other, and, thus, the welding defect is not generated.

Figure 10:
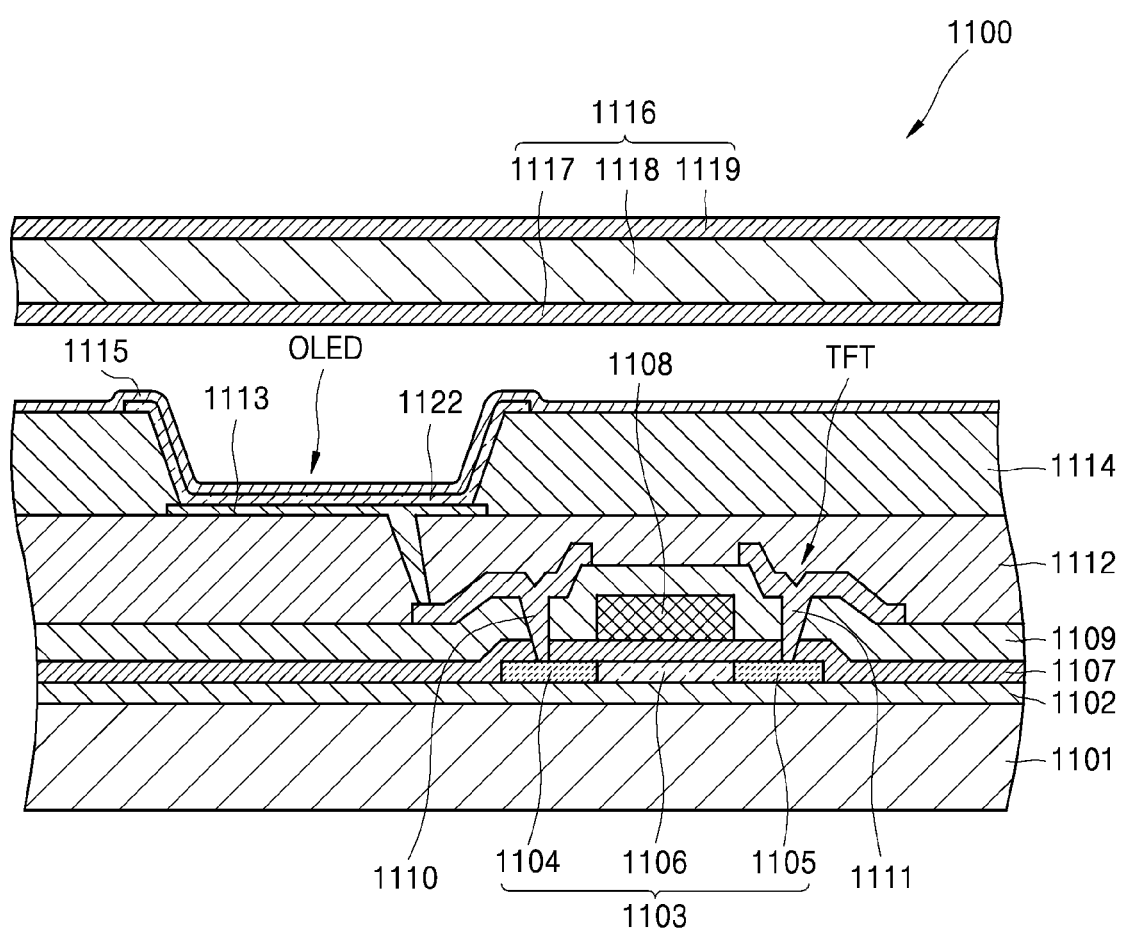
FIG. 10 is a cross-sectional view illustrating a sub-pixel of an organic light-emitting display apparatus including a light-emitting layer deposited on a display substrate by using the mask extension welding device of FIG. 3.

FIG. 10 is a cross-sectional view illustrating a sub-pixel 1100 of an organic light-emitting display apparatus including a light-emitting layer deposited on a display substrate by using the mask extension welding apparatus 300 of FIG. 3.

Referring to FIG. 10, the organic light-emitting display apparatus includes a display substrate 1101. The display substrate 1101 may be manufactured by using a flexible insulation material or a rigid insulation material. The display substrate 1101 may be transparent, semitransparent, or translucent.

A barrier film 1102 may be formed on the display substrate 1101. The barrier film 1102 may cover an entire upper surface of the display substrate 1101. The barrier film 1102 may include an inorganic film or an organic film.

A thin-film transistor TFT may be formed on the barrier film 1102. A semiconductor active layer 1103 may be formed on the barrier film 1102. A source region 1104 and a drain region 1105 may be formed on the semiconductor active layer 1103 by doping the semiconductor active layer 1103 with n-type impurity ions or P-type impurity ions. A channel region 1106 is formed in an area of the semiconductor active layer 1103 between the source region 1104 and the drain region 1105 without doping with impurities.

A gate insulation film 1107 may be deposited on the semiconductor active layer 1103. The gate insulation film 1107 may include an inorganic film, such as silicon oxide, silicon nitride, or metal oxide. The gate insulation film 1107 may be a single layer or a multilayer.

A gate electrode 1108 may be formed on an area of the gate insulation film 1107. The gate electrode 1108 may include a single film or a multilayer, which includes gold (Au), silver (Ag), copper (Cu), nickel (Ni), platinum (Pt), palladium (Pd), aluminum (Al), molybdenum (Mo), and chrome (Cr). The gate electrode 1108 may include aluminum-neodymium (Al:Nd) or Molybdenum-tungsten (Mo:W).

An interlayer insulation film 1109 may be formed on the gate electrode 1108. The interlayer insulation film 1109 may include an inorganic film, such as silicon oxide or silicon nitride, or an organic film.

A source electrode 1110 and a drain electrode 1111 may be formed on the interlayer insulation film 1109. In detail, a contact hole is formed by selectively removing portions of the gate insulation film 1107 and the interlayer insulation film 1109. Through the contact hole, the source region 1104 may be electrically connected to the source electrode 1110 and the drain region 1105 may be electrically connected to the drain electrode 1111.

A protection film (or passivation film and/or planarization film) 1112 may be formed on the source electrode 1110 and the drain electrode 1111. The protection film 1112 may include an inorganic film, such as silicon oxide or silicon nitride, or an organic film such as acryl, polyimide, or benzocyclobutene (BCB).

An organic light-emitting device OLED may be formed on an upper portion of the thin-film transistor TFT. The organic light-emitting device OLED may be formed on the protection film 1112. The organic light-emitting device OLED may include a first electrode 1113, an intermediate layer 1122 having an organic emissive layer, and a second electrode 1115.

The first electrode 1113 may function as an anode and may include various conductive elements. The first electrode 1113 may be a transparent electrode or a reflective electrode. For example, when the first electrode 1113 is the transparent electrode, the first electrode 1113 may include a transparent conductive film. When the first electrode 1113 is the reflective electrode, the first electrode 1113 may include a reflective film and a transparent film formed on the reflective film.

A pixel defining film 1114 may cover the protection film 1112 and a portion of the first electrode 1113. The pixel defining film 1114 may define a light-emitting region of each sub-pixel by surrounding an edge of the first electrode 1113. The first electrode 1113 may be patterned in each sub-pixel. The pixel defining film 1114 may include an organic film or an inorganic film. The pixel defining film 1114 may include a single film or a multilayer film.

The intermediate layer 1122 may be formed on the first electrode 1113 which is exposed by etching an area of the pixel defining film 1114. The intermediate layer 1122 may be formed by a vacuum deposition method. The intermediate layer 1122 may be patterned by a deposition material deposited through the deposition pattern units 321 of the divisional mask 320 manufactured by the mask extension welding apparatus 300 of FIG. 3.

The intermediate layer 1122 may include an organic emissive layer. As an alternative example, the intermediate layer 1122 may include the organic emissive layer and may further include at least one of a hole injection layer (HIL), a hole transport layer (HTL), an electron transport layer (ETL), and an electron injection layer (EIL). Alternatively, the intermediate layer 1122 may include the organic emissive layer and further include various functional layers.

The second electrode 1115 may be formed on the intermediate layer 1122. The second electrode 1115 may function as a cathode. The second electrode 1115 may include a transparent electrode or a reflective electrode. For example, when the second electrode 1115 is the transparent electrode, the second electrode 1115 may include a metal film and a transparent conductive film formed on the metal layer. When the second electrode 1115 is the reflective electrode, the second electrode 1115 may include a metal film.

According to an exemplary embodiment of the present invention, sub-pixels may be formed on the display substrate 1101, and each sub-pixel may realize red, green, blue, or white light. However, the present inventive concept is not limited thereto.

An encapsulation unit 1116 may be formed on an upper portion of the organic light-emitting device OLED. The encapsulation unit 1116 may be formed to protect the intermediate layer 1122 or other thin films from external moisture or oxygen. The encapsulation unit 1116 may include a glass having rigidity, polymer resin, or a flexible film. The encapsulation unit 1116 may include organic films 1117 and 1119 and an inorganic film 1118, which are alternately stacked on the organic light-emitting device OLED. According to an exemplary embodiment of the present invention, the encapsulation unit 1116 may include at least one of the organic films 1117 and 1119 and at least one inorganic film 1118.

Although certain exemplary embodiments and implementations have been described herein, other embodiments and modifications will be apparent from this description. Accordingly, the inventive concept is not limited to such exemplary embodiments, but rather to the broader scope of the presented claims and various obvious modifications and equivalent arrangements.

What is claimed is:

1. A mask extension welding apparatus for thin film deposition to extend and weld a mask on a frame, comprising:

an extension unit comprising a mask extension clamp configured to extend the mask in a first direction;

a pressure unit configured to press the mask towards the frame, the pressure unit comprising:
an upper housing;
a lower housing spaced apart from the upper housing with respect to a fluid inlet; and
a porous plate disposed downstream of the fluid inlet, the porous plate connecting the upper housing and the lower housing, and configured to eject a fluid supplied through the fluid inlet towards the mask; and
a laser welding unit configured to weld the mask and the frame.

2. The mask extension welding apparatus of claim 1, wherein the mask extension clamp extends both ends of the mask and fixes the both ends of the mask to the frame.

3. The mask extension welding apparatus of claim 1, wherein the pressure unit is configured to press the mask towards the frame so that surfaces of the mask and the frame facing each other are in close-contact with each other.

4. The mask extension welding apparatus of claim 1, wherein both ends of the mask are configured to be pressed by using the fluid supplied through the fluid inlet.

5. The mask extension welding apparatus of claim 1, wherein both ends of the mask are configured to be pressed by a corresponding side of the lower housing.

6. The mask extension welding apparatus of claim 5, wherein the laser welding unit is configured to irradiate laser light on a side of the mask in an internal direction or an external direction of the mask with respect to a contacting area between the lower housing and the both ends of the mask.

7. The mask extension welding apparatus of claim 5, wherein the fluid inlet is inclined to direct the fluid in an internal direction of the mask with respect to a contacting area between the lower housing and the both ends of the mask.

8. The mask extension welding apparatus of claim 5, wherein the fluid inlet is inclined to direct the fluid in an external direction of the mask with respect to a contacting area between the lower housing and the both ends of the mask.

9. The mask extension welding apparatus of claim 1, wherein surfaces of the upper housing and the lower housing facing each other are inclined with respect to the mask.

10. The mask extension welding apparatus of claim 1, wherein the porous plate connects the upper housing and the lower housing in an inclined state, and the porous plate is configured to eject the fluid supplied through the fluid inlet towards the mask.

11. The mask extension welding apparatus of claim 1, wherein:
the pressure unit comprises a first pressure unit and a second pressure unit;
the first pressure unit comprises the upper housing, the lower housing, and the porous plate; and
the second pressure unit comprises:
a supplementary upper housing;
a supplementary lower housing spaced apart from the supplementary upper housing with respect to a supplementary fluid inlet; and
a supplementary porous plate disposed downstream of the supplementary fluid inlet, the supplementary porous plate connecting the supplementary upper housing and the supplementary lower housing, and configured to eject a fluid supplied through the supplementary fluid inlet towards the mask.

12. The mask extension welding apparatus of claim 11, wherein:
the fluid inlet of the first pressure unit is inclined to direct the fluid in an internal direction of the mask with respect to a first contacting area between the lower housing of the first pressure unit and both ends of the mask; and
the supplementary fluid inlet of the second pressure unit is inclined to direct the fluid in an external direction of the mask with respect to a second contacting area between the supplementary lower housing of the second pressure unit and the both ends of the mask.

13. The mask extension welding apparatus of claim 11, wherein surfaces of the upper housing and the lower housing of the first pressure unit facing each other are inclined with respect to the mask.

14. The mask extension welding apparatus of claim 11, wherein surfaces of the supplementary upper housing and the supplementary lower housing of the second pressure unit facing each other are inclined with respect to the mask.

15. The mask extension welding apparatus of claim 11, wherein the porous plate of the first pressure unit connects the upper housing and the lower housing of the first pressure unit in an inclined state, the inclined state corresponding to an ejecting direction of the fluid supplied through the fluid inlet of the first pressure unit towards the mask.

16. The mask extension welding apparatus of claim 11, wherein the supplementary porous plate of the second pressure unit connects the supplementary upper housing and the supplementary lower housing of the second pressure unit in an inclined state, the inclined state corresponding to an ejecting direction of the fluid supplied through the supplementary fluid inlet of the second pressure unit towards the mask.

17. The mask extension welding apparatus of claim 1, wherein the fluid is gas.

18. The mask extension welding apparatus of claim 17, wherein the fluid is inert gas or air.

19. The mask extension welding apparatus of claim 1, wherein a pressure applied to the mask is controlled by a pressure of the fluid supplied through the fluid inlet and ejected from the porous plate.

20. The mask extension welding apparatus of claim 1, wherein a pressure of fluid is applied to an entire welding area of the mask and the frame.

* * * * *